United States Patent [19]

Lutz et al.

[11] Patent Number: 4,492,748
[45] Date of Patent: Jan. 8, 1985

[54] LIGHT-SENSITIVE POLYCONDENSATION PRODUCT CONTAINING DIAZONIUM AND DIALDEHYDE GROUPS, AND LIGHT-SENSITIVE RECORDING MATERIAL PREPARED THEREWITH

[76] Inventors: Walter Lutz, Eleonorenstrasse 130, 6503 Mainz-Kastel; Hartmut Steppan, Panoramastrasse 17, 6200 Wiesbaden; Fritz Erdmann, Hermann-Hesse-Strasse 38, 6500 Mainz, all of Fed. Rep. of Germany

[21] Appl. No.: 415,927

[22] Filed: Sep. 8, 1982

[30] Foreign Application Priority Data

Sep. 10, 1981 [DE] Fed. Rep. of Germany ....... 3135804

[51] Int. Cl.$^3$ .................... G03C 1/54; C07C 113/04
[52] U.S. Cl. .................................. 430/175; 430/157; 430/176; 430/277; 534/564
[58] Field of Search ..................... 430/175, 176; 260/141 R, 141 P

[56] References Cited

U.S. PATENT DOCUMENTS

| | | | |
|---|---|---|---|
| 2,063,631 | 12/1936 | Schmidt | 430/175 |
| 2,679,498 | 5/1954 | Seven et al. | 430/175 |
| 3,189,451 | 6/1965 | Reichel | 430/175 |
| 3,235,383 | 2/1966 | Steppan et al. | 430/175 |
| 3,679,419 | 7/1972 | Gillich et al. | 430/175 |
| 4,131,466 | 12/1978 | Nomura et al. | 430/175 |

FOREIGN PATENT DOCUMENTS

| | | | |
|---|---|---|---|
| 2323324 | 11/1974 | Fed. Rep. of Germany | 430/175 |
| 1424817 | 2/1976 | United Kingdom | 430/175 |

Primary Examiner—Charles L. Bowers, Jr.

[57] ABSTRACT

A light-sensitive diazonium group-containing polycondensation product of a diazonium salt corresponding to the general formula

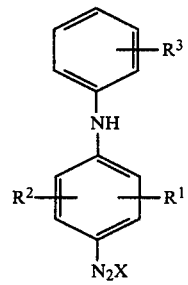

wherein
$R^1$, $R^2$, and $R^3$ denote hydrogen atoms, halogen atoms, alkyl groups having 1 to 3 carbon atoms or alkoxy groups having 1 to 6 carbon atoms, and
X denotes the anion of the diazonium salt, and an aldehyde selected from the group consisting of dialdehydes, acetals of dialdehyde hydrates, and esters of dialdehyde hydrates, a process for producing such a light-sensitive polycondensation product and a light-sensitive recording material comprising a layer support and a light-sensitive layer containing such a light-sensitive polycondensation product.

10 Claims, No Drawings

LIGHT-SENSITIVE POLYCONDENSATION PRODUCT CONTAINING DIAZONIUM AND DIALDEHYDE GROUPS, AND LIGHT-SENSITIVE RECORDING MATERIAL PREPARED THEREWITH

BACKGROUND OF THE INVENTION

The present invention relates to a light-sensitive polycondensation product comprising an aromatic diazonium salt and an aldehyde. The invention also relates to a light-sensitive recording material having a light-sensitive layer containing said polycondensation product.

It is known to produce polycondensation products by reacting aromatic diazonium salts, particularly diphenylamine-4-diazonium salts, with active carbonyl compounds, preferably formaldehyde. Condensation products of this type are described in U.S. Pat. No. 2,063,631. Their use in light-sensitive recording materials is described, e.g., in U.S. Pat. No. 3,235,383. Recording materials of this kind are widely used for industrial purposes, whereby products in which formaldehyde is used as the carbonyl compound for the condensation are practically the only ones which have gained acceptance. Other carbonyl compounds mentioned in the cited publications include higher aliphatic and aromatic aldehydes, ketones and quinones. A compound having differing carbonyl groups, namely anthraquinone-beta-aldehyde, is also mentioned. The reactivity of all these higher carbonyl compounds is lower than that of formaldehyde. This means that the reactions must be conducted under more severe conditions, e.g. more highly concentrated acids or higher temperatures must be used, which, in turn, favor the formation of by-products. In particular highly cross-linked, insoluble condensation products easily result from severe reaction conditions.

Although formaldehyde condensation products are still produced and used on a large industrial scale, they have the disadvantage that their composition and properties can only be varied to a very limited extent.

In more recent times it has been suggested to vary composition and properties by producing mixed condensation products, in the production of which a further second component which is condensible with formaldehyde is employed, in addition to a carbonyl compound and a diazonium salt. These products and their uses are described in U.S. Pat. No. 3,867,147. They can also be produced by condensing the diazonium salt with a second component which has been modified by introducing reactive groups. In the simplest case, the reactive groups are obtained by reacting formaldehyde with the second component. These condensation products yield high quality light-sensitive materials, in particular printing plates. Their production is more complicated, however, than the production of the simple formaldehyde condensation products, since it either requires a three component condensation reaction, which is more difficult to control, or a reaction in two stages.

SUMMARY OF THE INVENTION

It is therefore the object of the present invention to provide novel condensation products of aromatic diazonium salts, having advantageous properties similar to those of the known mixed condensation products, but which can be produced more easily than the known products.

Another object of the present invention is to provide a process for producing such a polycondensation product, in which a diazonium salt is reacted with a dialdehyde or with an acetal or an ester of a dialdehyde hydrate, in a strongly acid reaction medium.

A still further object of the invention is to provide a light-sensitive recording material comprising a layer support and a light-sensitive layer containing, as the light-sensitive compound, a polycondensation product containing such a diazonium group.

These and other objects of the invention are achieved by providing a light-sensitive diazonium group-containing polycondensation product of a diazonium salt corresponding to the general formula:

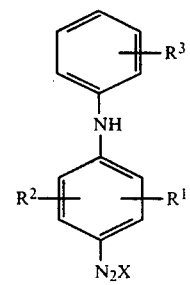

wherein
$R^1$, $R^2$ and $R^3$ denote hydrogen atoms, halogen atoms, alkyl groups having 1 to 3 carbon atoms or alkoxy groups having 1 to 6 carbon atoms, and
X denotes the anion of the diazonium salt
with an aldehyde selected from the group consisting of dialdehydes, acetals of dialdehyde hydrates, and esters of dialdehyde hydrates.

In another aspect of the invention, the objects are achieved by providing a process for preparing a light-sensitive diazonium group-containing polycondensation product comprising reacting a diazonium salt corresponding to the general formula:

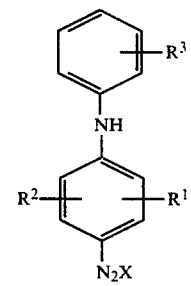

wherein
$R^1$, $R^2$, and $R^3$ denote hydrogen atoms, halogen atoms, alkyl groups having 1 to 3 carbon atoms or alkoxy groups having 1 to 6 carbon atoms, and
X denotes the anion of the diazonium salt
with an aldehyde selected from the group consisting of dialdehydes, acetals of dialdehyde hydrates and esters of dialdehyde hydrates in a strongly acid medium.

In a still further aspect of the invention, the objects are achieved by providing a light-sensitive recording material comprising a layer support and a light-sensitive layer containing as the light-sensitive compound, a diazonium group-containing polycondensation product of a diazonium salt corresponding to the general formula

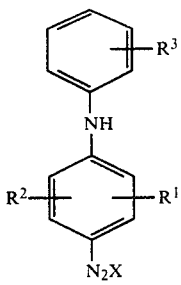

wherein
$R^1$, $R^2$, and $R^3$ denote hydrogen atoms, halogen atoms, alkyl groups having 1 to 3 carbon atoms or alkoxy groups having 1 to 6 carbon atoms, and X denotes the anion of the diazonium salt,
and an aldehyde selected from the group consisting of dialdehydes, acetals of dialdehyde hydrates, and esters of dialdehyde hydrates.

DETAILED DESCRIPTION OF PREFERRED EMBODIMENTS

It has surprisingly been found that, if dialdehydes or derivatives thereof are used as carbonyl compounds, the condensation reaction can be performed under relatively mild conditions, like the conditions possible and preferred for the condensation of formaldehyde, so that despite the manifold reactions which these carbonyl compounds may undergo, no highly crosslinked or insoluble products are formed.

Acetals and esters, i.e., the tetraacyl derivatives of the dialdehyde hydrates, are used as the derivatives of the dialdehydes. Due to their better reactivity, the dialdehydes and their acetals, in particular with lower alcohols having 1 to 4, preferably 1 to 2 carbon atoms, are preferred. Of the esters, preference is likewise given to the lower types having 1 to 5, preferably 1 to 2, carbon atoms in their acyl groups. Of the dialdehydes, both aliphatic and aromatic types may be employed. The aliphatic dialdehydes may generally contain from 2 to about 12, preferably 2 to 8, carbon atoms. The aromatic dialdehydes, which in most cases are preferred over the aliphatic dialdehydes, may contain one or several, optionally substituted, aromatic nuclei. Preference is thereby given to the mononuclear compounds or the binuclear types which are not fused. The benzene nuclei of the binuclear compounds may be linked by a single bond or by an intermediate group, such as, e.g., an ether oxygen atom, a sulfur atom or a short alkylene group.

Examples of suitable dialdehydes or dialdehyde derivatives include:
o-phthalic dialdehyde
terephthalic dialdehyde
diphenyl-4,4'-dialdehyde
diphenylether-4,4'-dialdehyde-tetramethylacetal
glyoxal tetraacetate
glyoxal tetraethylacetal
1,1,3,3-tetraethoxypropane
succinic dialdehyde tetraethylacetal
glutaric dialdehyde.

Useful diphenylamine-4-diazonium salts include compounds which may or may not have been substituted in ways known in the art. The diphenylamine-4-diazonium salts which have not been substituted or which have been substituted by an alkyl or especially, an alkoxy group having 1 to 3 carbon stoms, are particularly preferred. Compounds in which the alkyl or alkoxy group is in the 3-position are especially advantageous. Examples of suitable diazonium compounds include those derived from the following amines:
4-amino-3-methoxy-diphenylamine
4-amino-diphenylamine
4-amino-2-methoxy-diphenylamine
4'-amino-2-methoxy-diphenylamine
4'-amino-4-methoxy diphenylamine
4-amino-3-methyl-diphenylamine
4-amino-3-ethyl-diphenylamine
4'-amino-3-methyl-diphenylamine
4'-amino-4-methyl-diphenylamine
4-amino-3-ethoxy-diphenylamine
4-amino-3-hexyloxy-diphenylamine
4-amino-3-beta-hydroxy-ethyoxy-diphenylamine
4'-amino-2-methoxy-5-methyl-diphenylamine
4-amino-3-methoxy-6-methyl-diphenylamine
4'-amino-3,3'-dimethyl-diphenylamine
3'-chloro-4-amino-diphenylamine
4'-amino-4-n-butoxy-diphenylamine
4'-amino-3',4-dimethoxy-diphenylamine
4-amino-diphenylamine-2-sulfonic acid
4-amino-diphenylamine-2-carboxylic acid
4-amino-diphenylamine-2'-carboxylic acid
4'-bromo-4-amino-diphenylamine
4-amino-diphenylamine and 3-methyl-4-amino-diphenylamine are preferred. 3-methoxy-4-amino-diphenylamine is particularly preferred. Hydrogen sulfate is preferably used as the anion of the diazonium salt. The reaction is performed in a strongly acid medium.

Suitable condensation agents include phosphoric acid, methanesulfonic acid and sulfuric acid, which are used in concentrations of at least 40, preferably 70 to 100, percent by weight. The rest in general is water, but it may also be partly or completely composed of solvents, e.g., methanol, acetic acid, N-methyl pyrrolidone, and the like. Good results are achieved, for example, by using 85 to 93 percent strength phosphoric acid, 80 percent strength sulfuric acid or 90 percent strength methanesulfonic acid or mixtures of these acids.

Eighty to 100 percent strength, in particular 85 to 93 percent strength phosphoric acid is a rather mild condensation agent in which the condensation reaction can be conducted very gently. It, therefore, is the preferred condensation agent for all combinations of compounds which react fast enough under these rather gentle conditions.

Eighty to 100 percent strength, but in particular 90 percent strength methanesulfonic acid, is a stronger agent.

The process is preferably carried out in such a way that, on the one hand, as little acid as possible is used, but, on the other hand, a condensation mixture is obtained which can be easily stirred and mixed. When the type and quantity of the acid to be used are determined, its ability to undergo condensation reactions and the solubility of the components in the acid should be considered.

In general, the condensation is performed at temperatures from about 0° to about 70° C., preferably from 10° to 50° C.

The novel polycondensation products are generally recovered in the form of a salt and, after the addition of the other desired layer components, used for producing the recording material in this form.

The polycondensation products can, e.g., be separated and used as salts of the following acids: halogen hydracids, such as hydrofluoric acid, hydrochloric acid, hydrobromic acid, sulfuric acid, nitric acid, phosphoric acids (pentavalent phosphorous), in particular orthophosphoric acid, inorganic iso- and hetero-polyacids, e.g., phosphotungstic acid, phosphomolybdic acid, aliphatic or aromatic phosphonic acids or the half-esters thereof, arsonic acid, phosphinic acids, trifluoroacetic acid, amidosulfonic acid, selenic acid, hydrofluoboric acid, hexafluorophosphoric acid, perchloric acid, further aliphatic and aromatic sulfonic acids, e.g., methanesulfonic acid, benzenesulfonic acid, toluenesulfonic acid, mesitylensulfonic acid, p-chlorobenzenesulfonic acid, 2,5-dichlorobenzenesulfonic acid, sulfosalicylic acid, naphthalene-1-sulfonic acid, naphthalene-2-sulfonic acid, 2,6-di-tert.-butyl-naphthalenedisulfonic acid, 1,8-dinitro-naphthalene-3,6-disulfonic acid, 1,2-naphthoquinone-2-diazide-4-sulfonic acid, 1,2-naphthoquinone-2-diazide-5-sulfonic acid, and 1,2-naphthoquinone-1-diazide-4-sulfonic acid and 4,4'-diazido-stilbene-3,3-disulfonic acid.

Further organic sulfonic acids which can be used for separating the condensates are listed in columns 2 through 5 of U.S. Pat. No. 3,219,447.

Mesitylenesulfonic acid or methanesulfonic acid is particularly preferred.

In general, from 0.15 to 2 moles of dialdehyde per mole of diazonium salt are used for producing the polycondensation products. Products obtained from 0.35 to 1.2 moles of dialdehyde per mole of diazonium salt have proved to be particularly advantageous.

Polycondensates containing relatively small quantities of diazonium salts have been found to be less readily soluble in general. When they are subjected to copying tests on aluminum supports after separation as mesitylenesulfonates, they can be developed only with some difficulty.

One advantage of many of the condensates produced in accordance with the process of the invention is that they can also be easily separated in the form of salts which do not contain complex-forming metal salts. For example, many condensates give sulfates, chlorides and bromides which are sparingly soluble in water and can be easily precipitated from aqueous solutions of the condensaton mixtures by addition of the corresponding acids or water-soluble salts thereof. A more detailed description of the separation process will be given in the following Examples.

The polycondensation products of this invention are distinguished from the known diazonium salt polycondensation products by a number of advantages. Compared with the former condensation products of formaldehyde and diazonium salt, they are much easier to separate from the condensation medium and to isolate in a pure form.

Light-sensitive recording materials, particularly printing plates, produced with the novel condensation products are less sensitive to fingerprints and generally exhibit a higher sensitivity to light.

These properties essentially correspond to those of the mixed condensation products described in U.S. Pat. No. 3,867,147. Compared with these high quality products, the products of the invention have the advantage that they can be produced more easily or from starting materials which are more readily available.

For the production of copying materials, the diazonium salt polycondensation products are dissolved in an appropriate solvent, either alone or together with other layer components. Then the resulting solution is coated onto the intended support. The supports used for producing offset printing plates preferably are made of metallic materials, particularly aluminum which, prior to the coating step, generally is roughened by mechanical or electrochemical means, optionally subjected to an anodic oxidation process and preferably treated with a solution of silicates, certain complex-type salts, phosphonic acids or other known agents. The light-sensitive layer may be dried at room temperature or at elevated temperatures.

Various other substances may be additionally contained in the copying layers as further components. Examples of such additional layer ingredients include:

Acids, such as, e.g., phosphoric acid (in particular orthophosphoric acid), phosphonic acids, phosphinic acids; the strong acids mentioned in U.S. Pat. No. 3,235,382, such as sulfuric acid or organic sulfonic acids, e.g., toluenesulfonic acid; organic polyacids, e.g., polyvinylphosphonic acid.

Water-soluble polymers, such as e.g., polyvinyl alcohol, partly saponified polyvinyl acetate (acetyl content up to 40 percent), polyacrylamide, etc.

Water-insoluble polymers, such as phenolic resins, epoxy resins, urea resins and melamine resins, polyvinyl acetals, polyurethanes and polysulfonyl urethanes. Printing forms giving considerably higher printing runs are obtained by using copying layers, in which the polycondensates are contained in combination with polyvinylformal resins.

Colored pigments
Dyestuffs
Surfactants
Plastifiers

All additives should be chosen such that they are compatible with the diazo-condensates and that their absorption in the range of wavelengths which is essential for the photodecomposition of the diazo compounds is as low as possible.

In general, the admixtures are employed in the following quantities:

Acids of pentavalent phosphorus are generally used in quantities between 0.01 and 4 moles per mole of diazo group. The organic polyacids are, as far as they are readily water-soluble, generally used in quantities between 0.01 and 3 moles per mole of diazo groups.

The water-soluble polymers are generally used in quantities of up to 100 parts by weight, preferably up to 20 parts by weight, per part by weight of diazo polycondensate.

The added amount of water-insoluble polymers will generally not exceed 15 parts by weight per part by weight of diazo compound, the preferred range being 0.5 to 10 parts by weight.

If the copying layers contain water-soluble and/or water-insoluble polymers, colored or uncolored pigments are usually added in quantities of no more than 50 percent by weight of the polymers.

The quantities of plastifiers, dyestuffs, surfactants, sensitizers, indicators and fatty acids added to the copying layers are in general not higher than 20 percent by weight, preferably not more than 10 percent by weight, relative to the weight of the other layer cconstituents.

Depending on the layer constituents the solvents used for preparing the coating solutions may be, for example, water; alcohols, such as methanol or ethanol; glycol ethers, such as ethyleneglycol monoethyl ether; dimethyl formamide; diethylformamide, and the like.

Organic solvents in the pure form or containing little water are preferably employed for chlorides, bromides and salts of the novel diazo condensates, which are practically insoluble in water, such as e.g., the salts of organic sulfonic acids, tetrafluoroborates or hexafluorophosphates. In these cases, solvents in which these compounds are difficultly soluble, e.g., ethers such as dioxane or tetrahydrofuran; esters such as acetic acid ethylester, butyl acetate or ethyleneglycol monomethyl ether acetate; ketones such as methyl ethyl ketone or cyclohexanone, and the like, are added to the alcohols or amides which in general are good solvents for these compounds, in order to improve the leveling properties of the coatings.

During processing, the copying material is exposed imagewise through an original. Any light source conventionally used in the copying art which emits radiation in the long-wave ultraviolet and in the short-wave visible range, such as, e.g., carbon arc lamps, mercury high-pressure lamps, pulsed xenon lamps, and the like, may be employed for the imagewise exposure. Electron and laser irradiation may also be used for recording images.

After exposure, development is carried out by means of a suitable developer. Water, aqueous solutions of surfactants optionally containing an alkali admixture, mixtures thereof with organic solvents, aqueous salt solutions, aqueous acid solutions, e.g., solutions of phosphoric acids, which, in turn, may contain salts or organic solvents, or alkaline developers, e.g., aqueous solutions of sodium salts of phosphoric acid or silicic acid, can be employed as developers. Organic solvents may also be added to these developers. In some cases it is also possible to use organic solvents which have been diluted with water. Further constituents such as surfactants and hydrophilizing agents may also be contained in the developers.

Development is carried out in known manner, e.g., by dipping the plate into the developer liquid and/or wiping or spraying the developer liquid over the plate.

The following non-limiting examples illustrate the production of novel diazo polycondensates according to the invention and of the recording materials prepared therewith. In addition to the result of the elementary analysis, the molar ratio (calculated from the elemental analysis values) of the diazonium salt and the dialdehyde in the product formed is stated in a number of examples in order to characterize the diazo condensates employed more precisely. This ratio has been calculated under somewhat simplified conditions, i.e., the indicated values cannot be, nor are they intended to be, indications of the precise structure of the individual condensates according to the invention. They are sufficient, however, to identify condensation products which can be reproduced with specified properties.

As mentioned above, the conditions of condensation, and particularly the quantitative ratios used, are frequently of importance for a further characterization. In the examples, all data are contained which are required for the production of the respective condensates.

In the examples, parts by weight and parts by volume are related as grams and milliliters. Unless otherwise stated, parts and percentages are expressed in terms of weight. Temperatures are indicated in ° C. in the analysis values, N denotes the total nitrogen content.

In the examples, the term "raw condensate" denotes the raw condensation mixture obtained in the condensation, which normally still contains the condensation medium.

EXAMPLE 1

32.4 parts 3-methoxy-diphenylamine-4-diazonium sulfate were dissolved in 200 parts 90 percent methanesulfonic acid at room temperature. 31.8 parts diphenylether-4,4′dialdehydetetramethylacetal were added to this solution, and the mixture was condensed for 22 hours at 40° C. The clear raw condensate was poured into 2,000 parts by volume of water, and a precipitate formed. By adding 2,400 parts by volume of saturated sodium chloride solution, the raw condensate was converted into the chloride. The precipitate which was thereby formed was suspended in 2,000 parts by volume of water and converted into the mesitylene sulfonate by the addition of 50 parts sodium mesitylene sulfonate. 35 parts of a condensate were obtained (C: 67.5 percent, H: 5.4 percent, N: 6.4 percent, S: 4.9 percent; C:H:N:S=37:35:3:1). This means that 1.02 dialdehyde units were present in the condensate per diazo group. The diazo polycondensate was very readily soluble in ethyleneglycol monomethyl ether.

EXAMPLE 2

58.4 parts diphenylamine-4-diazonium sulfate were dissolved in 200 parts 90 percent methanesulfonic acid. 31.8 parts diphenylether-4,4′-dialdehydetetramethylacetal were added dropwise to this solution, and the mixture was condensed for 22 hours at 40° C. The raw condensate was poured into 2,000 parts by volume of water, and a clear solution was obtained. By adding 2,400 parts by volume of sautrated sodium chloride solution, the condensate was separated from the condensation medium as the chloride. It was dissolved in 5,000 parts by volume of water and converted into the mesitylene sulfonate by the addition of 50 parts sodium mesitylene sulfonate. 42 parts condensate were obtained. (C: 66.5 percent, H: 5.5 percent, N: 7.9 percent, S: 6.0 percent; C:H:N:S=29.5:2.3:3:1). 0.6 unit of dialdehyde was present in the condensate per diazo group.

EXAMPLE 3

58.6 parts diphenylamine-4-diazonium sulfate were dissolved in 200 parts 90 percent methanesulfonic acid. 21 parts diphenyl-4,4′ dialdehyde were added to this solution, and the condensation reaction was carried out for 20 hours at 40° C. The raw condensate was poured into 4,000 parts by volume of water, and a clear solution was obtained. The condensate was separated by adding 2,400 parts by volume of saturated sodium chloride. The chloride was dissolved in 4,000 parts by volume of water and converted into the mesitylene sulfonate by means of 50 parts sodium mesitylenesulfonate. 38 parts condensate were obtained. (C: 70.4 percent, H: 5.0 percent, N: 8.3 percent, S: 6.1 percent; C:H:N:S=29.7:25.3:3:0.97). 0.6 dialdehyde unit was contained in the condensate per diazo group.

EXAMPLE 4

64.8 parts 3-methoxydiphenylamine-4-diazonium sulfate were dissolved in 200 parts 93 percent phosphoric acid. 26.8 parts o-phthalic dialdehyde were then added at room temperature, and the resulting reaction mixture was condensed at 40° C. for 20 hours. The raw condensate was poured into 4,000 parts by volume of water, whereby a clear solution formed. By means of 4,800 parts by volume of saturated sodium chloride solution, the raw condensate was converted into the corresponding chloride. The precipitate was dissolved in 4,000 parts by volume of water and again precipitated with 20 parts of sodium mesitylene sulfonate. 80 parts condensate having the following elemental analysis were obtained: C: 62.4 percent, H: 5.3 percent, N: 7.1 percent, S: 5.1 percent; C:H:N:S=31:31:3:0.95. This means that 1.0 mole of o-phthalic dialdehyde units were contained in the condensate per mole of diazonium groups.

EXAMPLE 5

| Diazo compound: | 3-methoxy-diphenylamine-4-diazoniumsulfate |  |  |  |  |
|---|---|---|---|---|---|
| Aldehyde: | terephthalic dialdehyde |  |  |  |  |
|  | A |  | B |  | C |
| Molar ratio | Diazo:Dialdehyde 1:1 | | Diazo:Dialdehyde 1.5:1 | | Diazo:Dialdehyde 2:1 |
| parts | 64.8 | 26.8 | 97.2 | 26.8 | 129.6 | 26.8 |

Each of the above compounds was dissolved in 200 parts of 90 percent methanesulfonic acid at room temperature. Then condensation was effected for 15 hours at 40° C. Each of the resulting reaction mixtures was poured into 4,000 parts by volume of water. In the case of equimolar quantities of diazo compound and dialdehyde, a precipitate resulted, whereas little or no precipitate was formed when compounds B and C were used. The condensates were separated by means of 2,400 parts by volume of saturated sodium chloride solution. The solubility of the raw condensates precipitated as chlorides in 4,000 parts by volume of water decreased from A to C. By means of sodium mesitylene sulfonate, they were converted into the mesitylene sulfonates.

| A | | B | | C | |
|---|---|---|---|---|---|
| 97.6 parts sodium mesitylenesulfonate yield: 14.1 parts | | 73.2 parts sodium mesitylenesulfonate yield: 11.0 parts | | 48.8 parts sodium mesitylenesulfonate yield: 7.5 parts | |
| analysis % | atomic ratio | analysis % | atomic ratio | analysis % | atomic ratio |
| C 65.7 | 33.3 | C 64.8 | 44.2 | C 65.1 | 62.5 |
| H 5.2 | 31.6 | H 5.4 | 44.2 | H 5.2 | 58.4 |
| N 6.9 | 3 | N 7.7 | 4.5 | N 7.3 | 6 |
| S 5.2 | 0.98 | S 5.8 | 1.5 | S 5.7 | 2 |
| Molar ratio 1:1.1 | | diazonium groups:dialdehyde units 1.5:1.0        2:1.03 | | | |

EXAMPLE 6

64.8 parts 3-methoxy-diphenylamine-4-diazoniumsulfate were dissolved in 200 parts 93 percent phosphoric acid. 52.4 parts glyoxal tetraacetate were added and the mixture was condensed for 21 hours at 40° C. When the reaction mixture was poured into 4,000 parts by volume of water, a clear solution was obtained. By means of 1,000 parts by volume of saturated sodium chloride solution, the raw condensate was separated as the chloride, which was converted into the corresponding sulfonate by means of 24.4 parts sodium mesitylene sulfonate. 27 parts condensate were obtained. (C: 59.8 percent, H: 4.7 percent, N: 6.8 percent, S: 4.9 percent; C:H:N:S=30.5:29:3:0.9). The atomic ratios show that about 4 moles of dialdehyde units were contained in the condensate per mole of diazonium groups.

EXAMPLE 7

58.4 parts diphenylamine-4-diazoniumsulfate were dissolved in 200 parts 90 percent methanesulfonic acid. 24.4 parts succinic dialdehyde tetraethylacetal were added to this solution, and the mixture was condensed for 20 hours at 40° C. The raw condensate was poured into 2,000 parts by volume of water, and a difficultly water-soluble precipitate resulted. It was converted into the chloride by adding 1,000 parts sodium chloride solution. This precipitate was separated by suction filtering and again suspended in 4,000 parts by volume of water. Then the condensate was reprecipitated by means of 50 parts sodium mesitylene sulfonate. 30 parts condensate which separated as the mesitylene sulfonate were obtained. (C: 67.8 percent, H: 6.0 percent, N: 9.1 percent, S: 7.0 percent; C:H:N:S=26:27:3:1). The atomic ratio shows that 0.97 mole of dialdehyde units was present in the condensate per mole of diazonium groups. The product was readily soluble in ethyleneglycol monomethyl ether.

EXAMPLE 8

64.8 parts 3-methoxy-diphenylamine-4-diazoniumsulfate were dissolved in 200 parts 93 percent phosphoric acid, and 20 parts glutaric dialdehyde were added at room temperature. The reaction mixture was condensed for 18 hours at 40° C. The raw condensate was poured into 4,000 parts by volume water, and a clear solution was obtained. The condensate was separated from the reaction medium as the chloride by means of 4,800 parts by volume of saturated sodium chloride solution. The chloride was dissolved in 2,400 parts by volume of water and precipitated as the mesitylene sulfonate by means of 20 parts sodium mesitylene sulfonate. 17.6 parts condensate were obtained (C: 63.8 percent, H: 5.7 percent, N: 8.3 percent, S: 5.8 percent; C:H:N:S=27:29:3:0.92). This means that 1 mole of dialdehyde units was contained in the condensate per mole of diazonium groups.

EXAMPLE 9

Coating solutions containing the condensates described in Examples 1 through 8 were applied to an aluminum support which had been electrolytically roughened and pretreated with polyvinylphosphonic acid. The coating was dried with hot air. The coating solutions were composed as follows:
  5 parts diazo condensate
  0.5 part 85 percent phosphoric acid
  0.5 part Victoria Pure Blue FGA (C.I. Basic Blue 81)
  95 parts ethyleneglycol monomethyl ether The plates were exposed for 30 seconds through a negative original by means of a 5 kW metal halide lamp; the distance between the lamp and the vacuum copying frame being 100 cm. The exposed plates were developed with a developer having the following composition:
  15 parts pelargonic acid
  10 parts NaOH
  92 parts block copolymer comprising 90 percent propylene oxide and 10 percent ethylene oxide,
  12 parts sodium tetrapolyphosphate, and
  550 parts water

EXAMPLE 10

64.8 parts 3-methoxy-diphenylamine-4-diazoniumsulfate were dissolved in 200 parts 90 percent methanesulfonic acid. 13.4 parts terephthalic dialdehyde were added to this solution, and the mixture was condensed for 19 hours at 40° C. The raw condensate was poured into 2,000 parts by volume of water, and a clear solution was obtained. The condensate was separated in 1,200 parts by volume of saturated sodium chloride solution. The resulting chloride was suspended in 1,000 parts by volume of a saturated aqueous solution of sodium methane sulfonate. The resulting precipitate was separated by suction filtration, dissolved in 800 parts by volume of water and reprecipitated with 1,200 parts by volume of a saturated aqueous solution of sodium methane sulfonate. 34 parts condensate were obtained. (C: 53.5 percent, H: 4.8 percent, N: 8.5 percent, S: 8.0 percent; C:H:N:S=22:23.7:3:1.2). Equimolar quantities of diazonium groups and dialdehyde units were contained in the condensate.

PREPARATION OF A SCREEN PRINTING PLATE

A solution of 0.7 part of the above-described condensate in 12 parts by volume of water was added to 100 parts of a screen printing emulsion composed of 3 parts 53 percent dispersion of a vinyl acetate/maleic acid ester copolymer and 2 parts 24 percent solution of a polyvinyl alcohol having a Fikentscher K value of 75 and a residual acetyl group content of about 12 percent. The suspension was dyed with 5 parts by volume of a 5 percent solution of Crystal Violet. A polyester screen printing cloth was conventionally coated with the dyed solution, dried, exposed, developed with water and dried again. The obtained layer exhibited extraordinarily good resolution and light-sensitivity.

EXAMPLE 11

The condensates described in Example 5 could be combined with the following, solvent-soluble resins:

Polyvinyl butyral containing 69–71 percent polyvinyl butyral units, 1 percent polyvinyl acetate units and 24–27 percent polyvinyl alcohol units. The viscosity of a 6 percent solution at 20° C. was 4–6 mPa·s (DIN 53 015).

Unplasticized urea resin having an acid number of about 2.

The resins were mixed with the condensates in accordance with the following recipe:
1. part condensate,
0.1 part 85 percent phosphoric acid
3 parts resin,
0.4 part Victoria Pure Blue FGA, and
77 parts ethyleneglycol monomethyl ether.

After drying, the plates were exposed imagewise for 40 seconds through a negative original by means of a 5 kW metal halide lamp at a distance of 1 meter. The plates were thereafter converted into printing plates by wiping with a developer having the following composition:
50 parts water,
15 parts isopropanol,
20 parts n-propanol,
12.5 parts n-propyl acetate,
1.5 parts polyacrylic acid, and
1.5 parts acetic acid.

The printing plates, particularly those containing polyvinyl butyral, could be used for extremely long printing runs.

EXAMPLE 12

A synthetic resin plate, to which a thin copper foil had been laminated, was coated with the following solution after the copper surface had been cleaned with a scouring agent and rinsed with acetone:
1.0 part condensate described in Example 10,
3.0 parts cresol/formaldehyde novolac having a softening range of 105°–120° C. according to DIN 53 181
40 parts ethyleneglycol monomethyl ether, and
0.05 part Crystal Violet The weight of the applied layer was adjusted to 2 $g/m^2$. The plate was exposed for 2 minutes through a positive original representing a circuit diagram by means of a 5 kW metal halide lamp; the distance between the lamp and the vacuum copying frame being 100 cm. Development, during which the exposed layer areas were dissolved, was effected with a developer having the following composition:
3 parts sodium hydroxide,
3 parts sodium metasilicate × 12 $H_2O$
4 parts ethyleneglycol monobutyl ether, and
90 parts water.

In the exposed areas, the copper was etched away with a 40 percent aqueous iron (III) chloride solution to produce a copy of the circuit diagram.

The foregoing description and examples have been set forth merely to illustrate the invention and are not intended to be limiting. Since modifications of the disclosed embodiments incorporating the spirit and substance of the invention may occur to persons skilled in the art, the scope of the invention is to be limited solely with respect to the appended claims and equivalents.

We claim:

1. a light-sensitive diazonium group-containing polycondensation product of a diazonium salt corresponding to the general formula

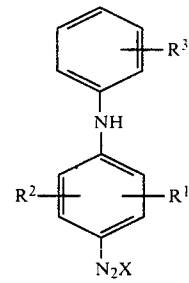

wherein
$R^1$, $R^2$, and $R^3$ denote hydrogen atoms, halogen atoms, alkyl groups having 1 to 3 carbon atoms, or alkoxy groups having 1 to 6 carbon atoms, and
X denotes the anion of the diazonium salt,
and an aldehyde selected from the group consisting of aromatic dialdehydes, acetals of dialdehyde hydrates, and esters of dialdehyde hydrates.

2. A light-sensitive polycondensation product according to claim 1, wherein said aldehyde is an aromatic dialdehyde.

3. A light-sensitive polycondensation product according to claim 2, wherein said aromatic dialdehyde contains one or two non-fused rings.

4. A light-sensitive polycondensation product according to claim 1, wherein said diazonium salt is selected from the group consisting of diphenylamine-4-diazonium salts and 3-methoxydiphenylamine-4-diazonium salts.

5. A light-sensitive polycondensation product according to claim 1, containing from 0.15 to 2 dialdehyde units per diazonium salt unit.

6. a light-sensitive polycondensation product according to claim 5, containing from 0.35 to 1.2 dialdehyde units per diazonium salt unit.

7. A light-sensitive polycondensation product according to claim 1, wherein said aldehyde is selected from the group consisting of o-phthalic dialdehyde, terephthalic dialdehyde, diphenyl-4,4'-dialdehyde, diphenylether-4,4'-dialdehyde-tetramethylacetal, glyoxal tetraacetate, glyoxal tetraethylacetal, 1,1,3,3-tetraethoxy-propane, and succinic dialdehyde tetraethylacetal.

8. A process for preparing a light-sensitive diazonium group-containing polycondensation product comprising reacting a diazonium salt corresponding to the general formula:

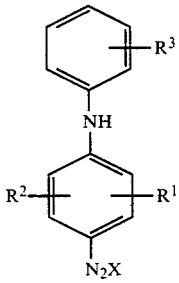

wherein $R^1$, $R^2$, and $R^3$ denote hydrogen atoms, halogen atoms, alkyl groups having 1 to 3 carbon atoms or alkoxy groups having 1 to 6 carbon atoms, and X denotes the anion of the diazonium salt and aldehyde selected from the group consisting of aromatic dialdehydes, acetals of dialdehyde hydrates and esters of dialdehyde hydrates in a strongly acid medium.

9. A process according to claim 8, wherein the polycondensation product is recovered in the form of a salt.

10. A light-sensitive recording material comprising a layer support and a light-sensitive layer containing as the light-sensitive compound, a diazonium group-containing polycondensation product of a diazonium salt corresponding to the general formula

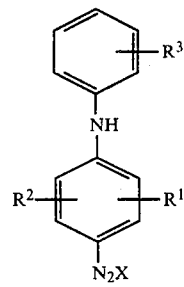

wherein
$R^1$, $R^2$ and $R^3$ denote hydrogen atoms, halogen atoms, alkyl groups having 1 to 3 carbon atoms or alkoxy groups having 1 to 6 carbon atoms, and X denotes the anion of the diazonium salt, and an aldehyde selected from the group consisting of aromatic dialdehydes, acetals of dialdehyde hydrates, and esters of dialdehyde hydrates.

* * * * *